United States Patent
Caldwell et al.

(10) Patent No.: US 9,912,144 B2
(45) Date of Patent: Mar. 6, 2018

(54) EMBEDDED OVERLOAD PROTECTION IN DELTA-SIGMA ANALOG-TO-DIGITAL CONVERTERS

(71) Applicant: ANALOG DEVICES TECHNOLOGY, Hamilton (BM)

(72) Inventors: Trevor Clifford Caldwell, Toronto (CA); Corey Petersen, Poway, CA (US); David Nelson Alldred, Toronto (CA); Hajime Shibata, Toronto (CA)

(73) Assignee: ANALOG DEVICES GLOBAL, Hamilton (BM)

( * ) Notice: Subject to any disclaimer, the term of this patent is extended or adjusted under 35 U.S.C. 154(b) by 501 days.

(21) Appl. No.: 14/477,236

(22) Filed: Sep. 4, 2014

(65) Prior Publication Data

US 2016/0072275 A1    Mar. 10, 2016

(51) Int. Cl.
     *H03M 1/12*      (2006.01)
     *H02H 7/12*      (2006.01)
     *H03M 3/00*      (2006.01)

(52) U.S. Cl.
     CPC ............ *H02H 7/12* (2013.01); *H03M 3/30* (2013.01); *H03M 3/36* (2013.01); *H03M 3/484* (2013.01); *H03M 3/464* (2013.01)

(58) Field of Classification Search
     USPC .................................................. 341/143, 155
See application file for complete search history.

(56) References Cited

U.S. PATENT DOCUMENTS

| | | | | |
|---|---|---|---|---|
| 4,851,841 A | * | 7/1989 | Sooch ................... | H03M 3/488 341/143 |
| 4,996,696 A | * | 2/1991 | McCabe ............... | H03M 3/024 341/143 |
| 5,051,799 A | * | 9/1991 | Paul ...................... | H04B 14/04 375/242 |

(Continued)

FOREIGN PATENT DOCUMENTS

| | | |
|---|---|---|
| WO | 2005/002059 | 1/2005 |
| WO | 2009/074470 | 6/2009 |

OTHER PUBLICATIONS

Mitteregger, Gerhard et al., "A 20-mW 640-MHz CMOS Continuous-Time ΣΔ ADC With 20-MHz Signal Bandwidth, 80-dB Dynamic Range and 12-bit ENOB", IEEE Journal of Solid-State Circuits, vol. 41, No. 12, Dec. 2006, 0018-9200/$20.00, pp. 2641-2649, 9 pages.

(Continued)

*Primary Examiner* — Ronald W Leja
(74) *Attorney, Agent, or Firm* — Patent Capital Group

(57) ABSTRACT

Delta-sigma modulators do not handle overload well, and often become unstable if the input goes beyond the full-scale range of the modulator. To provide overload protection, an improved technique embeds an overload detector in the delta sigma modulator. When an overload condition is detected, coefficient(s) of the delta sigma modulator is adjusted to accommodate for the overloaded input. The improved technique advantageously allows the delta sigma modulator to handle overload gracefully without reset, and offers greater dynamic range at reduced resolution. Furthermore, the coefficient(s) of the delta sigma modulator can be adjusted in such a way to ensure the noise transfer function is not affected.

20 Claims, 10 Drawing Sheets

(56) References Cited

U.S. PATENT DOCUMENTS

| | | | | |
|---|---|---|---|---|
| 5,585,801 | A | * | 12/1996 | Thurston .............. H03M 3/366 341/143 |
| 5,742,246 | A | | 4/1998 | Kuo et al. |
| 6,064,326 | A | * | 5/2000 | Krone .................. H03M 3/362 341/118 |
| 6,331,833 | B1 | | 12/2001 | Naviasky et al. |
| 6,384,761 | B1 | * | 5/2002 | Melanson ........... H03M 1/0668 341/118 |
| 7,081,843 | B2 | | 7/2006 | Melanson |
| 7,358,881 | B2 | | 4/2008 | Melanson |
| 7,474,247 | B1 | | 1/2009 | Heinks et al. |
| 7,486,215 | B1 | * | 2/2009 | Song .................. H03M 1/1295 341/143 |
| 8,249,540 | B1 | * | 8/2012 | Gupta .................... H04B 1/109 455/295 |
| 8,890,727 | B1 | * | 11/2014 | da Silva ............... H03M 1/185 341/118 |
| 9,319,062 | B2 | * | 4/2016 | Danneels .............. H03M 3/322 |
| 9,680,496 | B2 | * | 6/2017 | Kauffman .............. H03M 3/356 |
| 2001/0030610 | A1 | * | 10/2001 | Rochelle ................ G08B 21/02 340/686.6 |
| 2004/0017224 | A1 | * | 1/2004 | Tumer .................. H03F 3/087 327/51 |
| 2005/0187446 | A1 | * | 8/2005 | Nordstrom ......... A61B 5/14551 600/323 |
| 2006/0164272 | A1 | * | 7/2006 | Philips ................. H03M 3/344 341/143 |
| 2007/0004361 | A1 | * | 1/2007 | Srinivasan ........... H03G 3/3068 455/252.1 |
| 2008/0272950 | A1 | * | 11/2008 | Eastty .................. H03M 1/187 341/157 |
| 2009/0093687 | A1 | * | 4/2009 | Telfort ................. A61B 5/0002 600/300 |
| 2009/0309774 | A1 | * | 12/2009 | Hamashita .............. H03M 3/42 341/143 |
| 2011/0248875 | A1 | | 10/2011 | Holcombe |
| 2015/0123828 | A1 | * | 5/2015 | Alldred ................ H03M 3/376 341/143 |
| 2016/0065237 | A1 | * | 3/2016 | Danneels .............. H03M 3/322 341/143 |
| 2016/0072275 | A1 | * | 3/2016 | Caldwell ................ H02H 7/12 361/91.1 |
| 2016/0126724 | A1 | * | 5/2016 | Yun ..................... H04L 25/0276 361/111 |

OTHER PUBLICATIONS

"ADC12EU050 Ultra-Low Power, Octal, 12-bit, 45 MPSP Sigma-Delta Analog-to-Digital Converter", Texas Instruments, ADC12EU050, SNAS444I—Jan. 2008—Revised Apr. 2013, www.ti.com, 42 pages.

Hossain, Abul Bashar M Ishteak et al., "Sigma Delta Modulators with Hybrid Integrators", Fall, 2007, 4 pages.

"ADC Input Protection", Texas Instruments, Application Report SLAA593—Sep. 2013, © 2013, Texas Instruments Incorporated, www.ti.com, 4 pages.

Extended Search Report issued in EP Patent Application No. 1518607.1 dated Mar. 1, 2016, 17 pages.

\* cited by examiner

EMBEDDED OVERLOAD PROTECTION IN DELTA-SIGMA ANALOG-TO-DIGITAL CONVERTERS

TECHNICAL FIELD OF THE DISCLOSURE

The present invention relates to the field of integrated circuits, in particular to delta-sigma analog-to-digital converters.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an analog-to-digital converter (ADC) as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomenon, e.g., light, sound, temperature or pressure for data processing purposes. Designing an ADC is a non-trivial task because each application may have different needs in performance, power, cost and size. ADCs are used in a broad range of applications including communications, energy, healthcare, instrumentation and measurement, motor and power control, industrial automation and aerospace/defense. As the applications needing ADCs grow, the need for accurate and reliable conversion performance also grows.

BRIEF SUMMARY OF THE DISCLOSURE

Delta-sigma modulators do not handle overload well, and often become unstable if the input goes beyond the full-scale range of the modulator. To provide overload protection, an improved technique embeds an overload detector in the delta sigma modulator. When an overload condition is detected, coefficient(s) of the delta sigma modulator is adjusted to accommodate for the overloaded input. The improved technique advantageously allows the delta sigma modulator to handle overload gracefully without reset, and offers greater dynamic range at reduced resolution. Furthermore, the coefficient(s) of the delta sigma modulator can be adjusted in such a way to ensure the noise transfer function is not affected.

BRIEF DESCRIPTION OF THE DRAWING

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Basics of Analog-to-Digital Converters (ADCs)

Analog to digital converters (ADCs) are electronic devices that convert a continuous physical quantity carried by an analog signal to a digital number that represents the quantity's amplitude (or to a digital signal carrying that digital number). The conversion involves quantization of the analog input signal, so conversion would introduce a small amount of error. Typically the quantization occurs through periodic sampling of the analog input signal. The result is a sequence of digital values (i.e., a digital signal) that has converted a continuous-time and continuous-amplitude analog input signal to a discrete-time and discrete-amplitude digital signal.

An ADC is usually defined by the following application requirements: its bandwidth (the range of frequencies of analog signals it can properly convert to a digital signal), its resolution (the number of discrete levels the maximum analog signal can be divided into and represented in the digital signal), and its signal to noise ratio (how accurately the ADC can measure signal relative to the noise the ADC introduces). Analog-to-digital converters (ADCs) have many different designs, which can be chosen based on the application requirements.

Understanding Delta-Sigma Analog-to-Digital Converters (DS ADCs)

Analog-to-digital converters (ADCs) based on delta-sigma (DS) modulation (referred to herein as "DS ADCs", or in some cases as "DS modulators") have been widely used in digital audio and high precision instrumentation systems. A DS ADC usually provides the advantage of being able to convert an analog input signal to a digital signal with high resolution at low cost. Typically, a DS ADC encodes an analog signal using a DS modulator. A quantizer can be used for this purpose, employing, e.g., a low resolution ADC. If applicable, the DS ADC can apply a digital filter to the output of the DS modulator to form a higher-resolution digital output.

Figure 1:
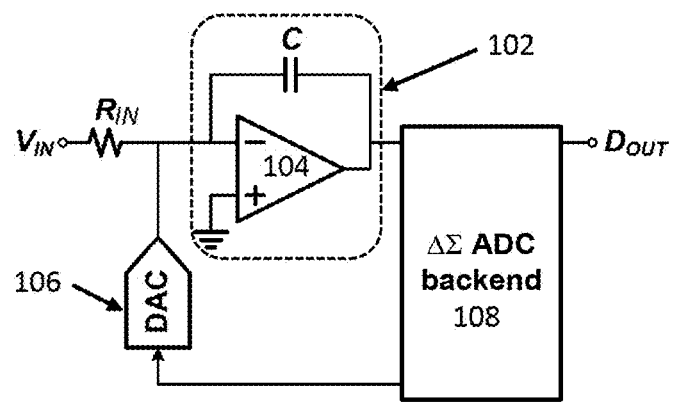
FIG. 1 shows an exemplary delta-sigma analog-to-digital converter.

FIG. 1 shows an exemplary delta-sigma analog-to-digital converter (DS ADC). The example shown is a continuous-time DS ADC, i.e., where at least some parts of the DS ADC is implemented using continuous-time circuits, for converting analog input $V_{IN}$ to a digital output $D_{OUT}$. Generally, a DS ADC would include a loop filter, a quantizer, and a feedback digital-to-analog converter. A resistor $R_{IN}$ represents the input resistor of the DS ADC. A loop filter is included to provide error feedback for the DS ADC and to help shape the noise from the quantizer out of baseband to higher frequencies. Making up part of the loop filter is a continuous-time integrator 102 comprising an operational amplifier (opamp) 104 and a feedback capacitor C of the amplifier 104. To provide error feedback, the error is usually generated by taking the difference between the original analog input signal $V_{IN}$ and a reconstructed version of the original analog input signal, which is generated using a feedback digital-to-analog-converter (DAC) 106. The feedback DAC 106 converts the digitized signal back into an analog signal. Depending on the order of the loop filter, more integrators and feedback paths can be provided (e.g., in the DC ADC backend 108) to provide a higher order loop filter.

Figure 2:
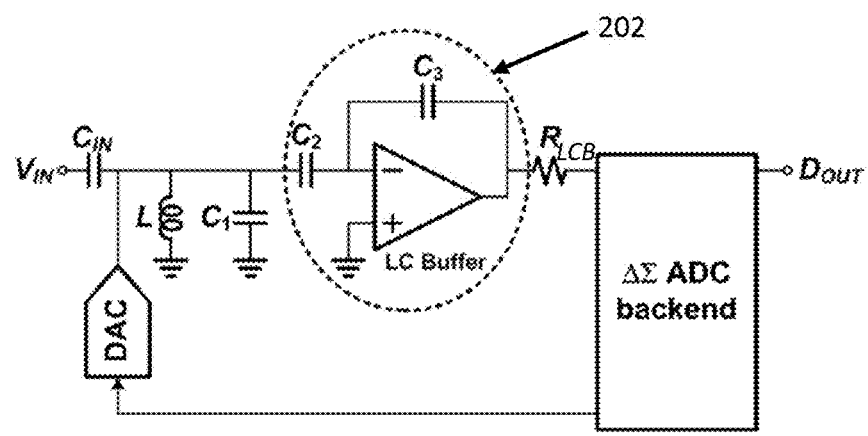
FIG. 2 shows an exemplary continuous-time bandpass delta-sigma analog-to-digital converter.

FIG. 2 shows an exemplary continuous-time bandpass delta-sigma digital-to-analog converter, which is an exemplary variant of the DS ADC shown in FIG. 1. In this implementation, the input resistor $R_{IN}$ (as seen in FIG. 1) is replaced by an input capacitor $C_{IN}$. The DS modulator of FIG. 2 includes an LC tank/resonator comprising L and $C_1$. The LC tank/resonator of the front end of the DS ADC is buffered by an LC buffer 202 (e.g., a buffer or a buffer gain stage following the LC circuit having L and $C_1$). The output of the LC buffer 202 has a resistor $R_{LCB}$.

FIGS. 1 and 2 serve to illustrate some possible circuit implementations of CT DS ADCs, and are not intended to be limiting to the disclosure.

Issues of Overload for Delta-Sigma ADCs and Problems of Some Overload Protection Mechanisms A DS modulator does not handle overload well. In other words, a DS modulator tend to behave badly when the input is too big. In the presence of signals larger than the allowable full-scale range of the modulator, it will go unstable and the output will be either at the positive rail, the negative rail, or oscillate back and forth. In some instances, when a signal overloads a DS modulator, a digital circuitry identifies that an overload has taken place (by recognizing that the outputs are at the positive or negative rails for several cycles) and then sends a reset signal to the modulator. This results in some downtime for the modulator since the output data is unusable for the time period from when the overload occurs to when the reset has completed. For these modulators, the DS modulator cannot recover even when the signal is back in range unless the integrators are reset. In some applications, this behavior is unacceptable and extra mechanisms are usually provided to the DS ADC to ensure that the input does not go beyond the allowable range.

To keep the DS modulator from overloading, one possible mechanism increases the needed number of flash ADC comparators (of the quantizer) and DAC current sources (of the feedback DAC) within the delta-sigma loop. In normal operation, these extra comparators and current sources are unused. But when the signal starts overloading the modulator, the extra comparators and current sources are used to keep the modulator stable. One disadvantage of such a system is that the extra comparators and current sources increase the load the node at the input of the flash ADC which can limit the speed of the modulator, and the extra current sources within the DAC can add noise to the overall system.

Another possibility to extend the "effective range" of a delta-sigma ADC is to add automatic gain control (AGC) at the front of the DS ADC to ensure the maximum input signal to the ADC will never overload the modulator. However, such a system is not always efficient. The disadvantage is that the AGC adds noise to the system and will increase the overall power because the AGC is always on. Also, the absolute level at the input to the AGC is required by the system, so changes in analog gain require the digital output to be inversely scaled.

Embedding Overload into a DS ADC

As an alternative to a discrete AGC block in front of the DS ADC, the AGC function can be incorporated into the delta-sigma ADC in such a way that it has little impact on the system when the signal is small (which is when the noise performance is most important). When the input signal increases in amplitude, the modulator coefficients can be adjusted to accommodate the larger input signal. For example, if the ADC front end in FIG. 1 experiences a larger input at $V_{IN}$, the input resistor $R_{IN}$ can be increased by a factor of X. The effect of adjusting the input resistor $R_{IN}$ changes the overall gain of the signal transfer function of the DS modulator, and the dynamic range of the ADC is effectively increased by a factor of X. However, this involves adjusting a node that will affect the circuitry in front of it (i.e., adjusting $R_{IN}$ changes the loading on the previous stage). Accordingly such a solution is not ideal, especially if changing the previous stage is not possible.

To alleviate some of the issues described above, an improved technique can be used to provide overload protection embedded in a DS modulator. An AGC function is effectively embedded into the DS modulator by sensing the internal state(s) to detect an overload condition. In response to detecting an overload condition, the internal coefficients of the DS modulator, such as the DAC current gain, can be adjusted when an overload condition is detected. Changing the internal coefficients would not severely affect the circuitry in front of it, making the AGC function internal to the DS modulator.

Embedding the AGC function and changing internal coefficients gracefully in response to an overload condition can be very useful in applications such as imaging where DS ADCs are typically required to overload more gracefully, and resetting with converter downtime is not acceptable.

These features are also advantageous for applications where the envelope of the signal has a finite attack and decay characteristics. Furthermore, the improved technique ensures a continuous-time delta-sigma ADC does not go unstable, and also allows it to gain some extra dynamic range at reduced resolution.

Figure 3:
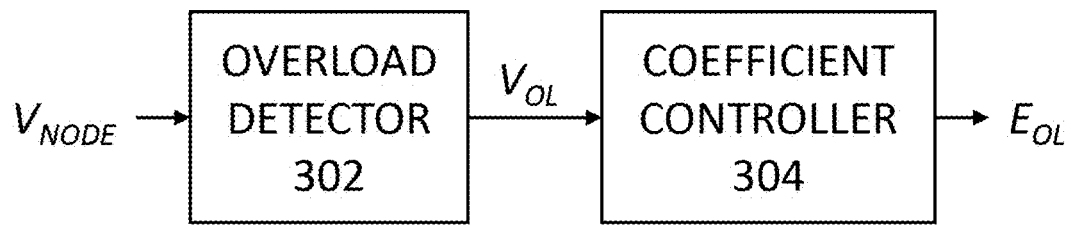
FIG. 3 is a system diagram of an exemplary apparatus for providing overload protection embeddable in a delta-sigma modulator, according to some embodiments of the disclosure.

FIG. 3 is a system diagram of an exemplary apparatus for providing overload protection embeddable in a delta-sigma modulator, according to some embodiments of the disclosure. The parts of the apparatus can include electronic circuitry to perform the functions described herein. In some cases, one or more parts of the apparatus can be provided by a processor specially configured for carrying out the functions described herein. The apparatus can include an overload detector 302 and a coefficient controller 304. Together, the overload detector 302 and the coefficient controller 304 can provide overload detection and adjustments of internal coefficients of the DS modulator. When an overload condition is detected by the overload detector 302, the gain of the DS modulator can be adjusted (while the DS modulator is in operation) to compensate for the overload condition. One important component which can change the gain of the DS modulator is the current gain of the feedback DAC. For this reason, the coefficient controller 304 can adjust the current gain, e.g., increase the current gain of the feedback DAC of the DS modulator, in response to an overload condition.

The overload detector 302 can be connected to one or more nodes in the delta-sigma modulator for detecting an overload condition in the delta-sigma modulator. The overload detector 302 can sense the level(s) at the one or more nodes to assess whether the DS modulator is in an overload condition. In response to detecting the overload condition, the coefficient controller 304 can adjust one or more coefficients of the delta-sigma modulator to compensate for the detected overload condition. Specifically, the one or more coefficients includes a first coefficient corresponding to a current gain of a feedback digital-to-analog converter of the delta-sigma modulator.

As shown in FIG. 3, the overload detector 302 takes a voltage of a node $V_{NODE}$ as input, and generates an output voltage $V_{OL}$—an overload signal (e.g., a signal which indicates overload has been detected). The output voltage $V_{OL}$ is generated based on $V_{NODE}$, and $V_{OL}$ depends on whether there is an overload condition in the DS modulator. The location of the node within the DS modulator can vary. The output voltage $V_{OL}$ (i.e., the overload signal) from the overload detector 302 serves as an input to coefficient controller 304, and the voltage level of $V_{OL}$ can signal to the coefficient controller 304 that an overload condition has been detected. Based on $V_{OL}$, the coefficient controller 304 generates one or more appropriate coefficient signals, e.g., $E_{OL}$, which is used to adjust one or more coefficients of the DS modulator. For instance, $E_{OL}$ can be provided as an input to a feedback DAC of the DS modulator to adjust the current gain of the feedback DAC. One implementation of the coefficient controller 304 can be as simple as passing $V_{OL}$ directly as $E_{OL}$. In some cases, the coefficient controller 304 can include circuitry for generating the level of $E_{OL}$ based on the level of $V_{OL}$ and/or other factors. In some instances, the coefficient controller 304 can include further input(s) and/or output(s) to provide more complex behavior.

Figure 4:
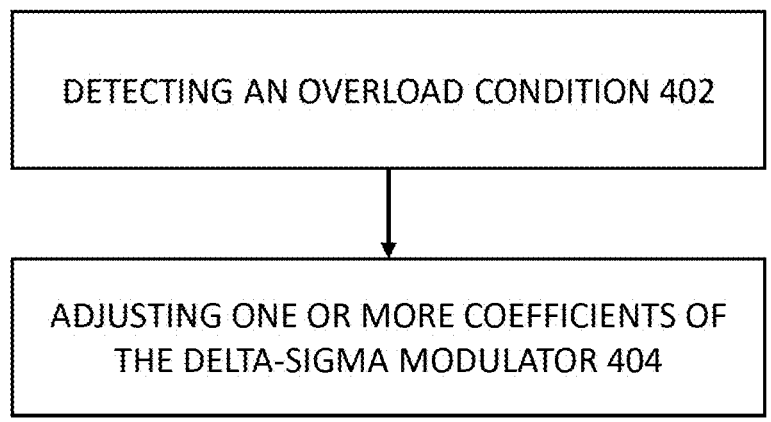
FIG. 4 is a flow diagram of an exemplary method for providing overload protection embedded in a delta-sigma modulator, according to some embodiments of the disclosure.

The components shown in FIG. 3 can perform a corresponding method shown in FIG. 4. FIG. 4 is a flow diagram of an exemplary method for providing overload protection embedded in a delta-sigma modulator, according to some embodiments of the disclosure. The method can include detecting an overload condition in the delta-sigma modulator using an overload detector connected to one or more nodes in the delta-sigma modulator (box 402). In response to detecting the overload condition, one or more coefficients of the delta-sigma modulator are adjusted to compensate for the detected overload condition, wherein a first coefficient of the one or more coefficients corresponds to a current gain of a feedback digital-to-analog converter of the delta-sigma modulator (box 404).

Implementing an Overload Detector in a DS Modulator

Broadly speaking, an overload condition is detected if a signal level has gone outside of an allowable or acceptable range, e.g., if a signal level at the one or more nodes in the DS modulator is above a first threshold (top of an allowable range) or if the signal level at the one or more nodes in the DS modulator is below a second threshold (bottom of an allowable range). Overload detection can be done at different nodes in the DS modulator and be able to sufficiently sense whether the DS modulator is in an overload condition, or whether the input signal to the DS modulator (e.g., $V_{IN}$ as seen in FIGS. 1 and 2) would cause the DS modulator to overload.

Typically, the sensing by the overload detector can be performed using a comparator having a voltage at a node in the DS modulator and a reference voltage as inputs. The comparator can detect when the input signal to the DS modulator is too large and the output of the comparator can signal to a coefficient controller to change one or more internal coefficients to accommodate the larger input signal. For instance, the comparator can compare the voltage at a node against the reference voltage, to assess whether the voltage at the node has exceeded a predetermined or specified reference voltage. If the voltage at the node exceeds the reference voltage, the overload detector determines that the DS modulator is in an overload condition. The reference voltage can depend on the particular DS modulator, and can be determined empirically through testing.

The comparator of the overload detector can be used at the input of the DS modulator, or somewhere in the loop of the DS modulator. For instance, the node can be an input node to a front-end of the delta-sigma modulator. In another instance, the node can be an output node of an integrator or LC buffer of the delta-sigma modulator. In yet another instance, the node can be an output of an analog-to-digital converter of the delta-sigma modulator. If the DS modulator is of a higher order DS modulator, the comparator of the overload detector can also be used in other loops of the higher order DS modulator (e.g., in the DS ADC backend). For instance, the one or more nodes can include one or more nodes of a first stage of the delta-sigma modulator, and/or one or more nodes of a second stage of the delta-sigma modulator. The following passages describes different variations of placing the overload detector in a DS modulator. It is envisioned that a plurality of overload detectors can be provided at a plurality of nodes in the DS modulator.

Figure 5:
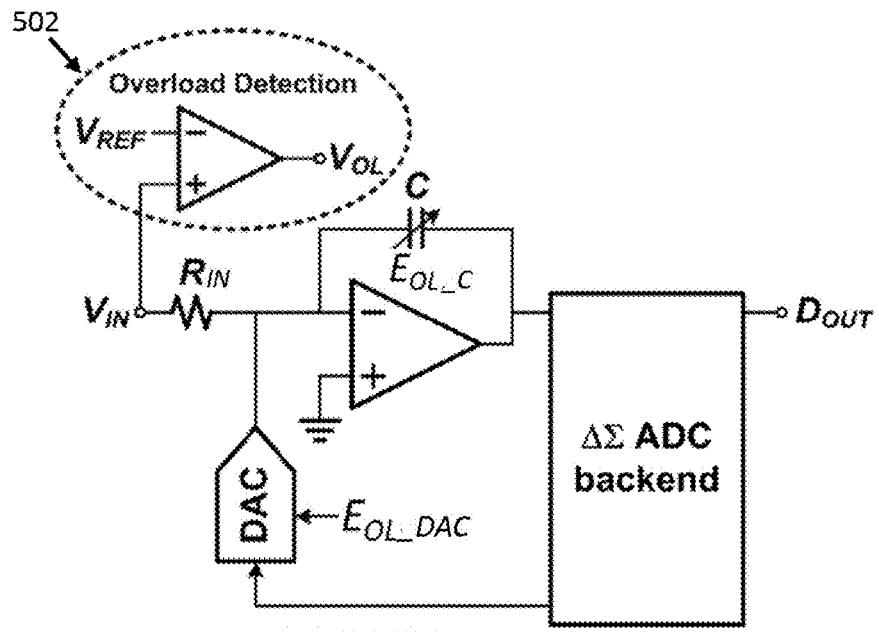
FIG. 5 illustrates an exemplary implementation of an apparatus for providing overload protection embedded in a delta-sigma modulator, according to some embodiments of the disclosure.

FIG. 5 illustrates an exemplary implementation of an apparatus for providing overload protection embedded in a delta-sigma modulator, according to some embodiments of the disclosure. An overload detector 502 in this example is provided at or near the input $V_{IN}$. The voltage $V_{IN}$ is compared against $V_{REF}$, and the output of the comparator $V_{OL}$ can serve as the output of the overload detector signaling whether the DS modulator is in an overload condition. For instance, the output $V_{OL}$ can be provided to a coefficient controller to generate one or more coefficient signals to adjust one or more internal coefficients of the DS modulator.

Figure 6:
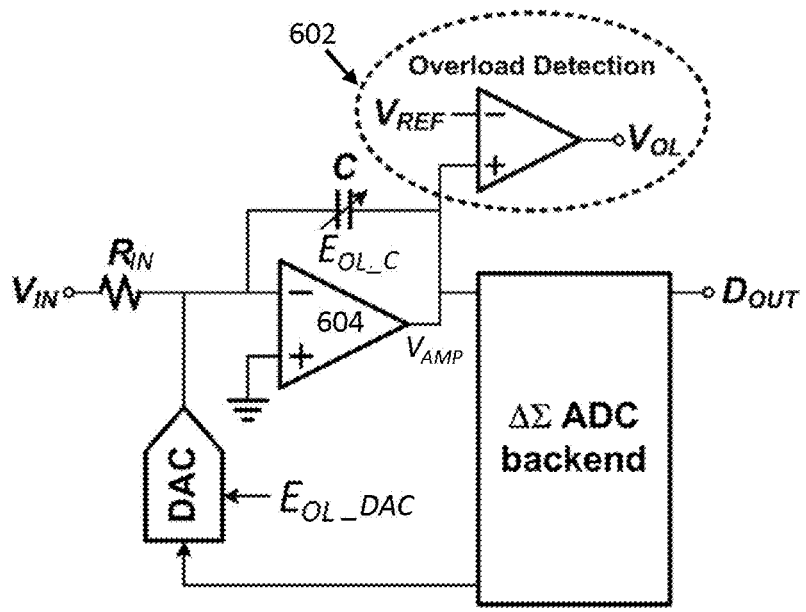
FIG. 6 illustrates another exemplary implementation of an apparatus for providing overload protection embedded in a delta-sigma modulator, according to some embodiments of the disclosure.

FIG. 6 illustrates another exemplary implementation of an apparatus for providing overload protection embedded in a delta-sigma modulator, according to some embodiments of the disclosure. Depending on whether certain components are on or off chip (components of the DS ADC is generally provided together as one chip, but $R_{IN}$ could be off chip), it may be more desirable or in some cases necessary to provide an overload detector within the DS loop, e.g., after an amplifier. In some cases, having an overload detector at the input (e.g., such as the one shown in FIG. 5) can also cause some kick back at the input which may be undesirable. This may be another reason for choosing the implementation shown in FIG. 6 over FIG. 5. In this example, the overload detector 602 is provided at the output of opamp 604, i.e., at the output of the integrator (the opamp 604 with the feedback capacitor C). The voltage $V_{AMP}$ at the output of opamp 604 is compared against $V_{REF}$, and the output of the comparator $V_{OL}$ can serve as the output of the overload detector signaling whether the DS modulator is in an overload condition. For instance, the output $V_{OL}$ can be provided to a coefficient controller to generate one or more coefficient signals to adjust one or more internal coefficients of the DS modulator.

Figure 7:
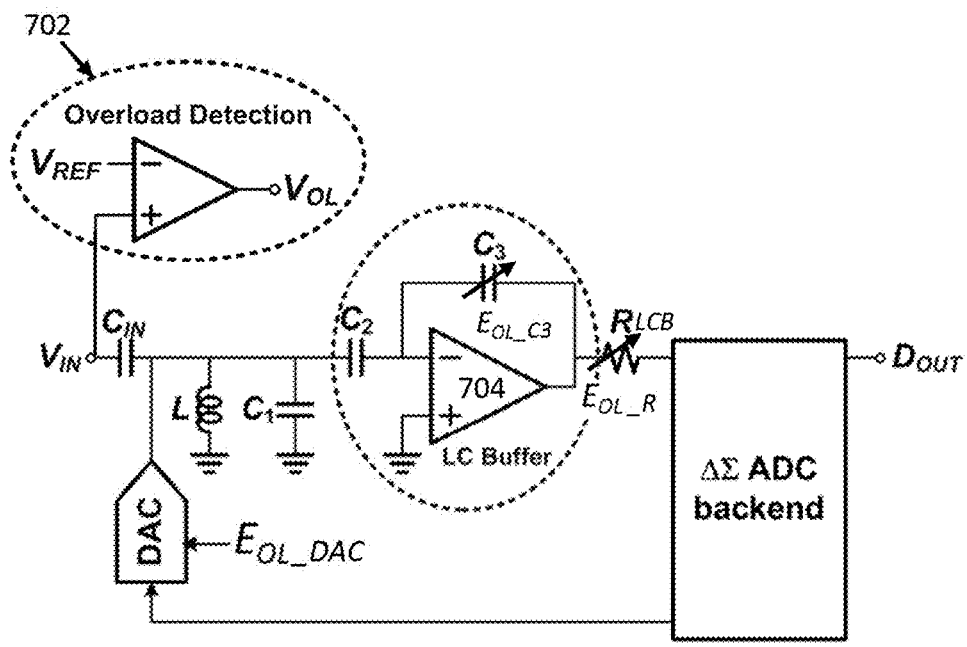
FIG. 7 illustrates an exemplary implementation of an apparatus for providing overload protection embedded in a continuous-time bandpass delta-sigma modulator, according to some embodiments of the disclosure.

FIG. 7 illustrates an exemplary implementation of an apparatus for providing overload protection embedded in a continuous-time bandpass delta-sigma modulator, according to some embodiments of the disclosure. An overload detector 702 in this example is provided at or near the input $V_{IN}$. The voltage $V_{IN}$ is compared against $V_{REF}$, and the output of the comparator $V_{OL}$ can serve as the output of the overload detector signaling whether the DS modulator is in an overload condition. For instance, the output $V_{OL}$ can be provided to a coefficient controller to generate one or more coefficient signals to adjust one or more internal coefficients of the DS modulator.

Figure 8:
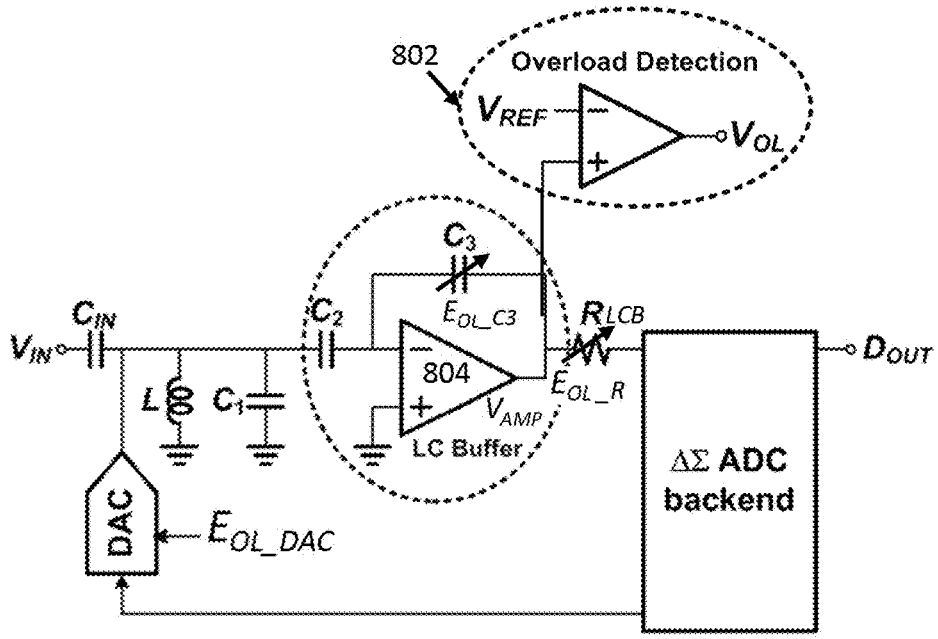
FIG. 8 illustrates another exemplary implementation of an apparatus for providing overload protection embedded in a continuous-time bandpass delta-sigma modulator, according to some embodiments of the disclosure.

FIG. 8 illustrates another exemplary implementation of an apparatus for providing overload protection embedded in a continuous-time bandpass delta-sigma modulator, according to some embodiments of the disclosure. Depending on whether certain components are on or off chip (components of the DS ADC is generally provided together as one chip, but $C_{IN}$ could be off chip), it may be more desirable or in some cases necessary to provide an overload detector within the DS loop, e.g., after an amplifier. In some cases, having an overload detector at the input (e.g., such as the one shown in FIG. 7) can also cause some kick back at the input which may be undesirable. This may be another reason for choosing the implementation shown in FIG. 8 over FIG. 7. In this example, the overload detector 802 is provided at the output of opamp 804, i.e., at the output of the LC buffer (the opamp 804 with the feedback capacitor $C_3$ of the opamp 804). The voltage $V_{AMP}$ at the output of opamp 804 is compared against $V_{REF}$, and the output of the comparator $V_{OL}$ can serve as the output of the overload detector signaling whether the DS modulator is in an overload condition. For instance, the output $V_{OL}$ can be provided to a coefficient controller to generate one or more coefficient signals to adjust one or more internal coefficients of the DS modulator.

Adjusting One or More Coefficients and Preserving Noise Transfer Function

It can be seen from FIGS. 5-8 that a coefficient controller can generate one or more signals to control internal coefficients of the DS modulator. Broadly speaking, one coefficient signal can be provided to a plurality of components in the DS modulator to adjust the coefficients, or different coefficients signals can be provided to the plurality of components.

While it is possible to simply adjust the current gain of the feedback DAC in response to detecting an overload condition, it is also possible to adjust one or more other coefficients in response to an overload condition. The determination of which coefficients to adjust and how to adjust the coefficients is not trivial. In particular, it may be desirable to adjust the one or more coefficients in such a way to improve the stability of the DS ADC. For instance, adjusting the one or more coefficients of the delta-sigma modulator to compensate for the detected overload condition can include determining one or more coefficients to ensure or such that a gain of a signal transfer function of the delta-sigma modulator changes while a noise transfer function of the delta-sigma modulator or a loop gain of the delta-sigma modulator remains substantially unchanged. The effect of this adjustment allows the gain of the signal transfer function (STF) of the DS ADC ($D_{OUT}/V_{IN}$, if referring back to the FIGURES) to change to compensate for the overload condition, while not affecting the noise transfer function (NTF), which may require the loop gain to be unaffected or preserved.

For a continuous time DS ADC, a plurality of coefficients can be adjusted to allow a larger full-scale input in response to an overload condition (as opposed to adjusting the input resistor $R_{IN}$). Specifically, the front-end DAC current gain can be increased by X while the gain of the integrator can be decreased by X to substantially preserve the loop gain of the DS modulator. The gain of the integrator, such as the one seen in FIGS. 1, 5, and 6, can be decreased by increasing capacitance C by X.

For a continuous time bandpass DS ADC, the internal coefficients can also be adjusted to allow a larger full-scale input in response to an overload condition. Specifically, the front-end DAC current gain can be increased by X while the gain of the LC buffer can be decreased by X to substantially preserve the loop gain of the DS modulator. The gain of the LC buffer, such as the one seen in FIGS. 2, 7, and 8, can be decreased by increasing capacitance $C_3$ by X. In a continuous-time bandpass delta-sigma modulator where the input resistor is replaced by an input capacitor $C_{IN}$ (as shown in FIGS. 2, 7, and 8), it may not be desirable to adjust the input capacitor since it contributes to the resonance of the front-end LC tank/resonator comprising L and $C_1$. As a result, adjusting the coefficients involves changing the current gain of the feedback DAC as well as a change in the LC buffer gain to preserve the NTF as well as the DS ADC backend internal states. Once again the only change is in the STF gain. Alternatively, the size of $R_{LCB}$ at the output of the opamp can be adjusted as opposed to the gain of the LC buffer (or both could be adjusted); this has the same benefit of preserving the ADC backend as well as the NTF, except the LC buffer will have a larger signal $V_{AMP}$ at its output. With these changes, the internal states of the DS modulator remain the same so the operation of the ADC backend does not get affected, and the NTF is preserved. The only change is the gain of the STF.

Broadly speaking, any suitable combination of the coefficients can be used to change the STF gain of the DS modulator while maintaining the NTF of the DS modulator (i.e., the loop gain).

One exemplary coefficient corresponds to a gain of an integrator or LC buffer of the delta-sigma modulator. Adjusting this coefficient can include adjusting a size of a feedback capacitor of an amplifier of the delta-sigma modulator. In some cases, to ensure the NTF remains unaffected, adjusting the one or more coefficients of the DS modulator in response to the overload condition comprises adjusting a first coefficient corresponding to the current gain of the feedback digital-to-analog converter of the delta-sigma modulator to increase the current gain and adjusting a second coefficient corresponding to the gain of the integrator or LC buffer of the delta-sigma modulator. Adjusting both the first coefficient and the second coefficient allows the (net) loop gain of the DS modulator to remain unchanged, thereby preserving the NTF of the DS modulator to improve the stability of the DS modulator.

Another exemplary coefficient corresponds to a size of a resistor at an output of an amplifier of the delta-sigma modulator. In some cases, to ensure the NTF remains unaffected, adjusting the one or more coefficients comprises adjusting a first coefficient corresponding to the current gain of the feedback digital-to-analog converter and adjusting a third coefficient corresponding to a size of a resistor an output of an amplifier of the delta-sigma modulator to increase the size of the resistor. In some cases, the second coefficient corresponding to the gain of integrator or LC buffer of the delta-sigma modulator is also adjusted.

In the examples shown in FIGS. 5-6, a coefficient signal $E_{OL\_DAC}$ is provided to adjust the current gain of the feedback DAC, and a coefficient signal $E_{OL\_C}$ is provided to control the size of the feedback capacitor C of the amplifier to adjust the gain of the integrator. In examples shown in FIGS. 7-8, a coefficient signal $E_{OL\_DAC}$ is provided to adjust the current gain of the feedback DAC, a coefficient signal $E_{OL\_C3}$ is provided to control the size of the feedback capacitor $C_3$ of the amplifier to adjust the gain of the LC buffer, and $E_{OL\_R}$ is provided to control the size of the resistor $R_{LCB}$ at the output of the opamp 704 and opamp 804 (respectively for FIGS. 7 and 8).

Adjusting the Current Gain of the Feedback DAC

Various embodiments herein describe a technique which provides real time overload detection without having to reset the integrators of the DS modulator or suffer any down time. In other words, the one or more coefficients are adjusted while the delta-sigma modulator is operating to convert an input analog signal into a digital signal. For real time overload detection and adjustment of coefficients internal to the DS modulator to be successful, the DAC currents and capacitor are preferably switched quickly to ensure optimal operation.

Typically, a large resistor is provided as an array of resistors which can be programmed to turn on or off quickly. A large capacitor is also typically provided as an array of capacitors which can be programmed to turn on or off quickly. Since size of resistors and capacitors are usually programmable, switching and adjusting them is not a problem. However, it is not trivial to change the current gain of the feedback DAC having a plurality of current sources within a small number of cycles. If designed properly, the feedback DAC can be configured with one or more switches to allow the adjustment of current gain of the feedback DAC to occur more quickly, especially if the switches are sized appropriately, they can be switched within a single clock cycle. The following passages describes how a particular strength of a current cell can be adjusted or programmed to allow the current gain of the feedback DAC to be adjusted (without having to increase the number of current cells being used for the feedback DAC).

Figure 9:
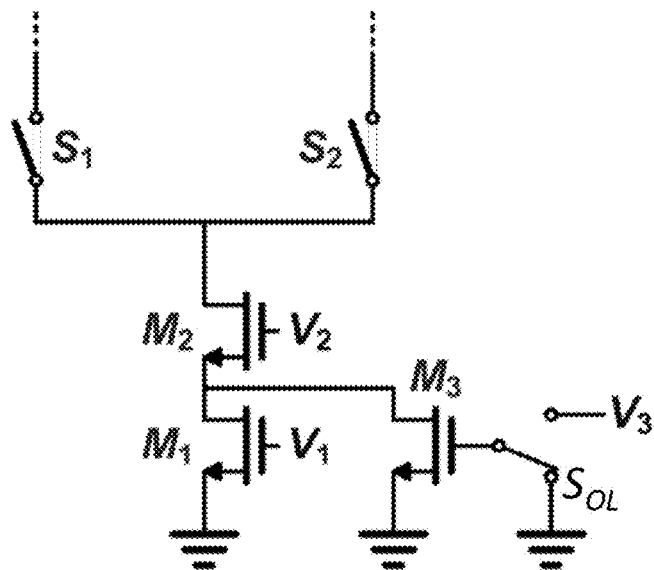
FIG. 9 illustrates an exemplary programmable digital-to-analog converter current cell, according to some embodiments of the disclosure.

FIG. 9 illustrates an exemplary programmable digital-to-analog converter current cell, according to some embodiments of the disclosure. The circuit configuration shown can be used to increase or decrease the current gain of the programmable current cell. M2 and M1 are transistors devices whose gate voltages are biased by V2 and V1 (respectively). M2 and M1 as a cascode current cell provide a current source for the feedback DAC. Typically M3 would have the same finger sizes as M1 (and therefore V3=V1), but since DAC current sources tend to be large devices that are too slow to turn on/off in a single clock cycle, transistor M3 can be smaller to provide the desired current. When an overload condition is detected, extra current can be pumped into the current cell by turning the transistor M3 on, i.e., by causing the switch $S_{OL}$ to connect the gate of M3 to V3 to bias M3 to turn on. This could potentially degrade the linearity but the minor non-linearity may be an acceptable trade-off since the speed of this circuit can impact the overall performance of the ADC.

Figure 10:
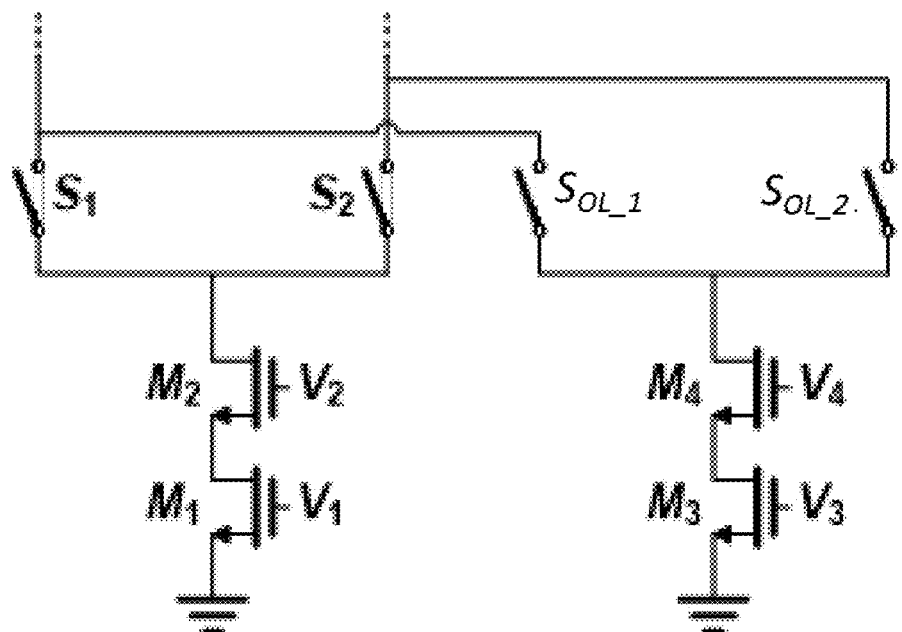
FIG. 10 illustrates another exemplary programmable digital-to-analog converter current cell, according to some embodiments of the disclosure.

FIG. 10 illustrates another exemplary programmable digital-to-analog converter current cell, according to some embodiments of the disclosure. Alternatively, the DAC current can be increased by increasing the number of parallel current cells. The transistors M2 and M1 whose gate voltages are biased by V2 and V1 (respectively) are arranged in a cascode current cell configuration and form a first current cell. The transistors M4 and M3 whose gate voltages are biased by V4 and V3 (respectively) are arranged in a cascode current cell and form a second current cell parallel to the first current cell. In this case, when overload is detected, $S_{OL\_2}$ and S1 would be closed, as would S2 and $S_{OL\_1}$ to allow current from both the first and second current sources to be added together; otherwise when overload is not detected, $S_{OL\_1}$ and $S_{OL\_2}$ would remain off or open. While this cell has higher linearity since the transistors are biased at a constant current density even during overload (when compared to the programmable current cell of FIG. 9), this current cell introduces more parasitic capacitance on the output node due to the extra switches.

The examples shown in FIGS. 9 and 10 show some examples of adjusting the current gain of the feedback DAC, e.g., illustrating different implementations for increasing the strength of the DAC current cell without having to increase the number of the current cells. Other mechanisms are also envisioned by the present disclosure. For instance, varied sizing of the transistors can be provided in order to achieve certain desired amount of gain adjustments for the current gain of the feedback DAC (e.g., to provide the STF gain changes to values that allow the digital gain to be accomplished with simple bit shifts and sums, e.g., ×2, ×1.5, ×1.25, ×1.75, etc.). In other instances, the circuit topology of having the extra switches and transistors can be replicated (using transistors of the same size or of different sizes) to achieve certain desired amounts or levels of gain adjustments for the current gain of the feedback DAC.

Multi-Level Overload Detector

The overload detection mechanisms described herein can easily be extended to multiple overload detection levels where coefficients can depend on the level or amplitude detected by the overload detector or the extent of the overload detector.

Figure 11A:
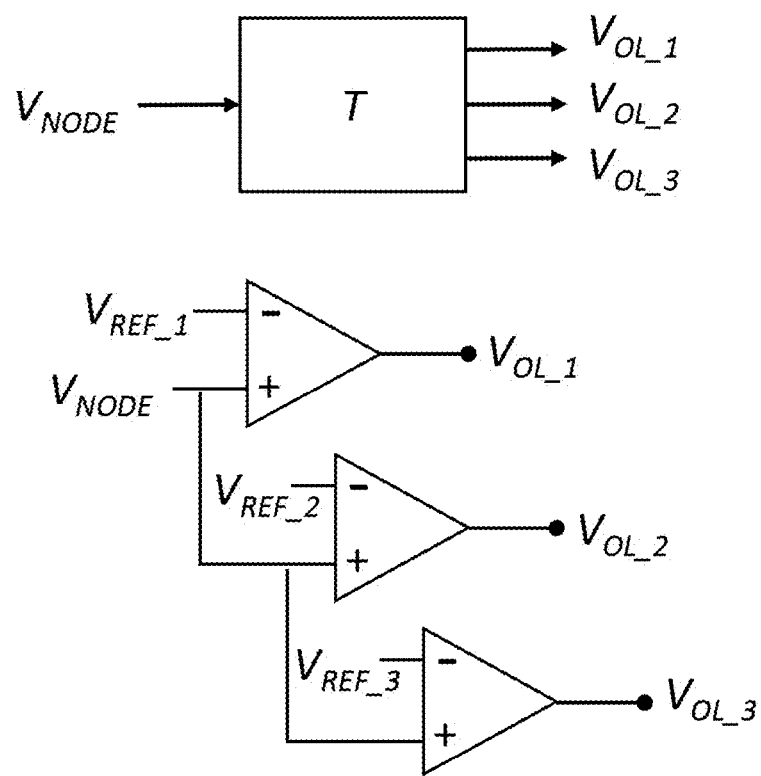
FIG. 11A-B illustrate exemplary multi-level overload detectors, according to some embodiments of the disclosure.

FIG. 11A illustrates an exemplary multi-level overload detector, according to some embodiments of the disclosure. An overload detector can take a voltage level $V_{NODE}$ of a node in a DS modulator as input, apply a suitable function T, and generate an overload signal having a plurality of levels (or "states"), and/or a plurality of overload signals $V_{OL\_1}, V_{OL\_2}, \ldots V_{OL\_N}$ (each having two "states", although not excluding tri-state signals). For either case, the overload detector can provide an overload signal or a plurality of overload signals which the coefficient controller can take as input(s) to adjust the coefficients differently. In an example shown in FIG. 11A, a plurality of comparators can be used to compare the voltage $V_{NODE}$ against a plurality of different of voltage references (e.g., $V_{REF\_1}$, $V_{REF\_2}$, $V_{REF\_3}$) to generate various overload signals (e.g., $V_{OL\_1}$, $V_{OL\_2}$, and $V_{OL\_3}$).

Figure 11B:
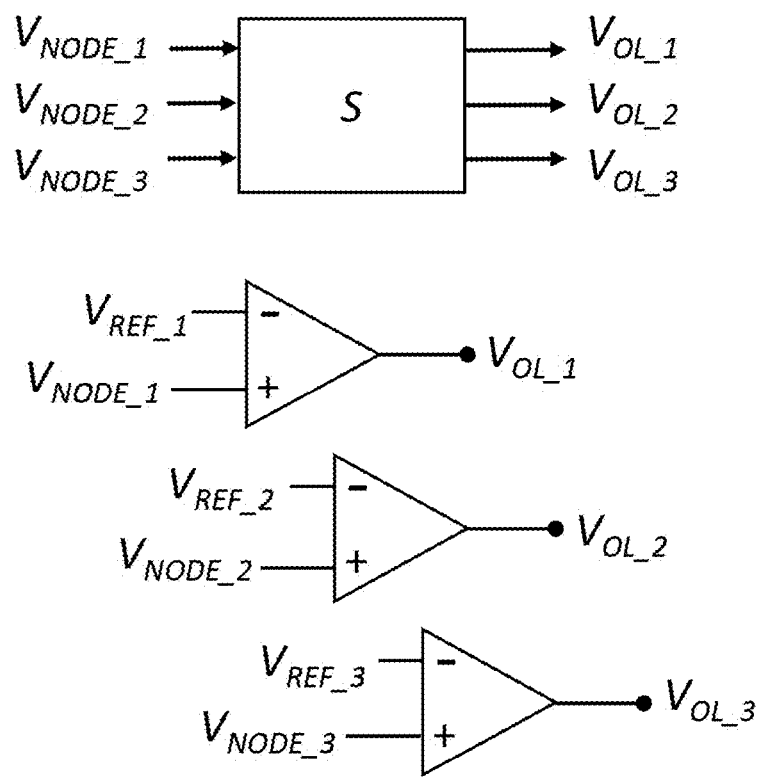

FIG. 11B illustrates an exemplary multi-level overload detector, according to some embodiments of the disclosure. This example shows an overload detector which detects the extent of overload condition. The extent of an overload condition of a DS modulator can relate to, e.g., number of voltages above a threshold, ratio of voltages above a threshold, over a certain number of voltages above a threshold, a particular set of voltages above a threshold based on a rule, etc. An overload detector can take a plurality of voltage level at different nodes $V_{NODE\_1}$, $V_{NODE\_2}$, ... $V_{NODE\_N}$ of the DS modulator as inputs, apply a suitable function S, and generate an overload signal having a plurality of levels (or "states"), and/or a plurality of overload signals $V_{OL\_1}$, $V_{OL\_2}$, ... $V_{OL\_N}$ (each having two "states", although not excluding tri-state signals). For either case, the overload detector can provide an overload signal or a plurality of overload signals which the coefficient controller can take as input(s) to adjust the coefficients differently (or adjust the coefficients depending on the overload signal(s)). In an example shown in FIG. 11, a plurality of comparators can be used to compare the voltages $V_{NODE\_1}$, $V_{NODE\_2}$, $V_{NODE\_3}$ of different nodes of the DS modulator against a plurality of voltage references (e.g., $V_{REF\_1}$, $V_{REF\_2}$, $V_{REF\_3}$) to generate various overload signals (e.g., $V_{OL\_1}$, $V_{OL\_2}$, and $V_{OL\_3}$). The voltage references can be the same or at least some of them can be different from each other.

Generally speaking, varying DAC current values (and corresponding coefficient changes) can ensure stable operation over a larger range. Providing the flexibility would result in varying STF gains depending on the degree or level of overload detected.

Return to Normal Detector

After an overload condition is detected, another circuit can be provided to assess whether the signal is low enough to return to normal operation. Such a circuit is referred herein as a "return to normal detector". When the return to normal detector detects the signal is low enough (for a prescribed period of time) to return to normal operation, the coefficients of the DS modulator can be adjusted back to its previous or typical values. A return to normal detector can also determine whether the DS modulator is no longer in an overload condition. The signal that a return to normal detector uses to make its determination can be taken from any suitable node in the DS modulator, as the voltage level at any node or voltage levels at a combination of nodes can provide an indication whether the DS modulator remains in an overload condition. For simplicity, the following examples describes using the digital output signal of the DS modulator $D_{OUT}$ as the signal.

Figure 12:
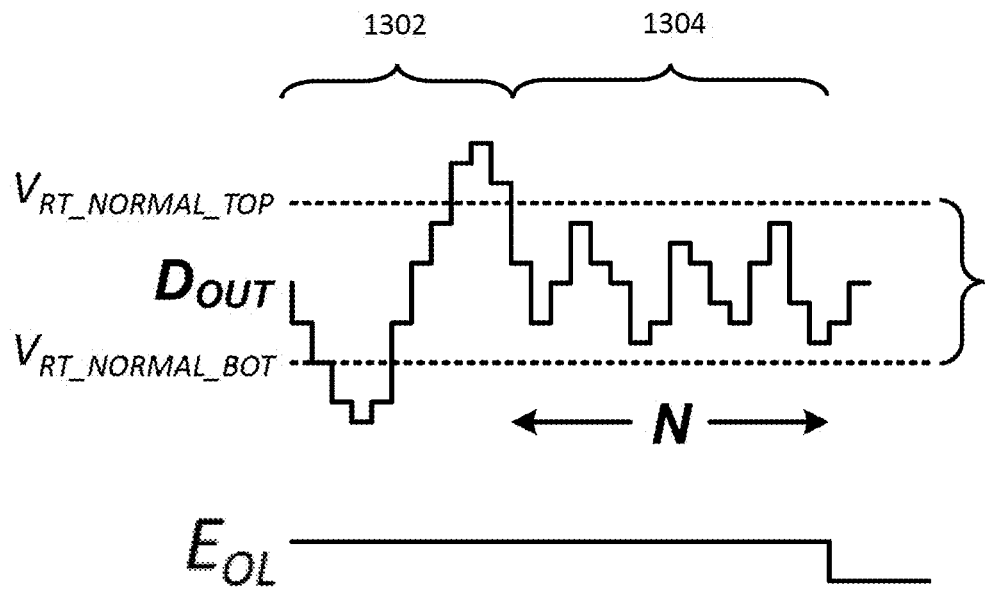
FIG. 12 illustrates an exemplary output signal returning to normal causing the correction signal to reduce or turn off overload protection, according to some embodiments of the disclosure.

FIG. 12 illustrates an exemplary output signal returning to normal causing the correction signal to reduce or turn off overload protection, according to some embodiments of the disclosure. As it can be seen from FIG. 12, when a coefficient signal $E_{OL}$ signal is "high", a coefficient (e.g., the current gain of the feedback DAC) is adjusted to compensate for the overload condition, and a first part 1302 of the signal $D_{OUT}$ is representative of a signal operating normally in response to the coefficient(s) being adjusted when an overload condition has been detected. At a certain point in time, the input to the DS modulator is no longer outside of the allowable range of the DS modulator, and the signal $D_{OUT}$ begins to get smaller, as seen in the second part 1304 of the signal $D_{OUT}$. When the signal $D_{OUT}$ begins to get smaller, it is an indication that the DS modulator is likely to no longer be in an overload condition (i.e., the DS modulator has exited the overload condition).

Based on this insight, a return to normal detector can evaluate previous N samples of the digital output $D_{OUT}$ and determine whether or not the signal has been within a predefined (digital) threshold for a specified time period. For example, the return to normal detector can determine whether $D_{OUT}$ is within the range between $V_{RT\_NORMAL\_TOP}$ and $V_{RT\_NORMAL\_BOT}$. If true, the coefficients of the DS modulator (e.g., the coefficient signal $E_{OL}$) can revert back to their typical values until the next overload is detected. For instance, the return to normal detector can utilize one or more comparators to assess whether $D_{OUT}$ is small enough for the coefficient(s) to return to previous or typical values.

Figure 13:
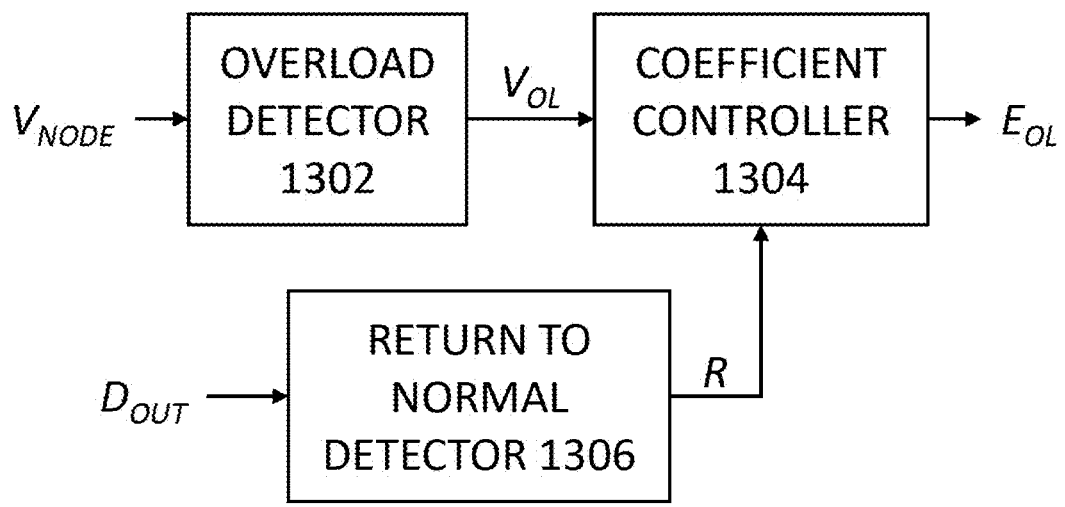
FIG. 13 is a system diagram of an exemplary apparatus for providing overload protection embeddable in a delta-sigma modulator with a return to normal detector, according to some embodiments of the disclosure.

FIG. 13 is a system diagram of an exemplary apparatus for providing overload protection embeddable in a delta-sigma modulator with a return to normal detector, according to some embodiments of the disclosure. The apparatus includes an overload detector 1302 (which is similar to or same as overload detector 302 of FIG. 3), a coefficient controller 1304 (which is similar to or same as coefficient controller 304 of FIG. 3), and a return to normal detector 1306. The return to normal detector 1306 takes $D_{OUT}$ (or other suitable signal(s)) to determine whether the DS modulator has returned to normal (i.e., no longer in an overload condition), and outputs a signal R to the coefficient controller 1304 to adjust the coefficients back to normal or previous values. For instance, the coefficient(s) can return to a typical value.

In some embodiments, the return to normal detector 1306 can determine whether a digital output of the delta-sigma modulator is within a normal range for the period of time. In certain embodiments, the return to normal detector 1306 can determine whether one or more signal levels of the one or more nodes of the delta-sigma modulator is within a normal range for the period of time.

If the apparatus for providing overload protection supports detecting multiple levels of overload detection (as explained in relation to FIGS. 11A-B), the return to normal detector can also support return to different levels of overload conditions. The return to normal can, be modified to assess whether the DS modulator has returned to different levels of overload conditions and adjust the coefficients accordingly (e.g., progressively dial back the amount of compensation for overload, or bump up the amount of compensation if the DS modulator has reached a higher level of overload, etc.).

Figure 14:
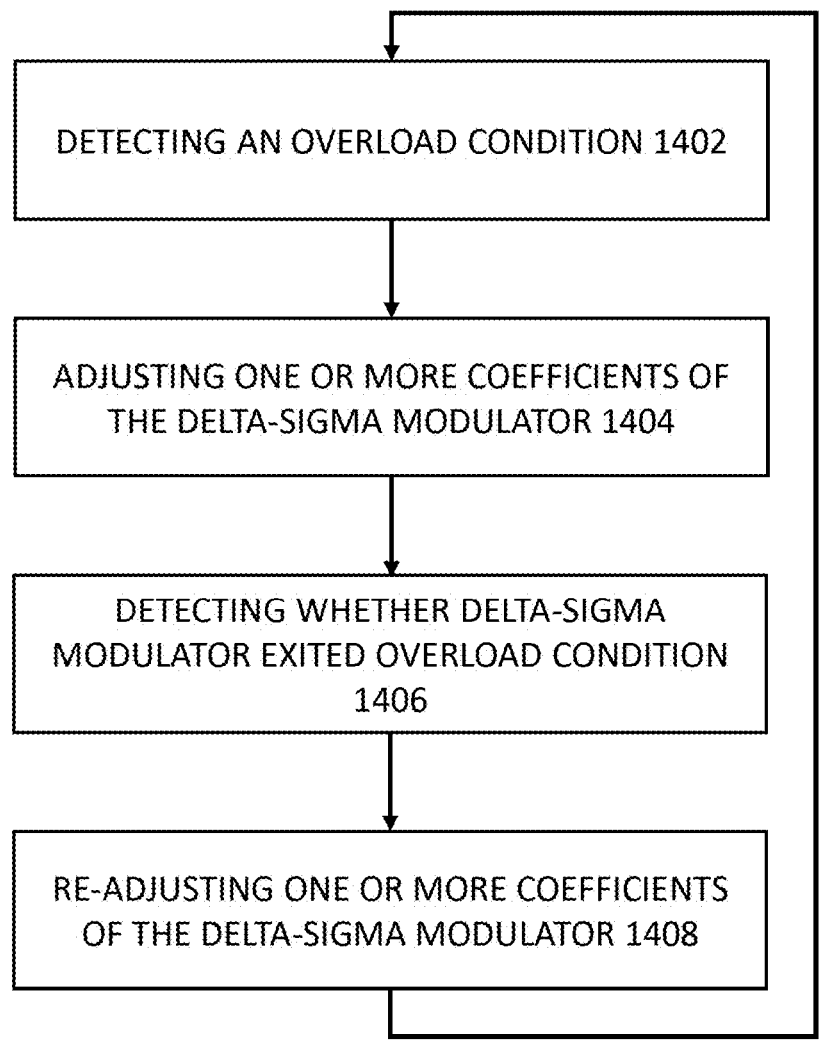
FIG. 14 is a flow diagram of an exemplary method for providing overload protection embeddable in a delta-sigma modulator with a return to normal detector, according to some embodiments of the disclosure.

FIG. 14 is a flow diagram of an exemplary method for providing overload protection embeddable in a delta-sigma modulator with a return to normal detector, according to some embodiments of the disclosure. The method is an extension to the method shown in FIG. 4. In particular, the parts of the method in box 1402 and 1404 corresponds to the parts of the method in box 402 and 404 respectively. However, an additional check is performed, where the method includes determining whether the delta-sigma modulator has exited the overload condition for a period of time (box 1406). In response to determining the delta-sigma modulator has exited the overload condition for the period of time, the method includes adjusting the one or more coefficients to decrease compensation for the overload condition (box 1408). The method can loop back to the beginning (back to box 1402).

Figure 15:
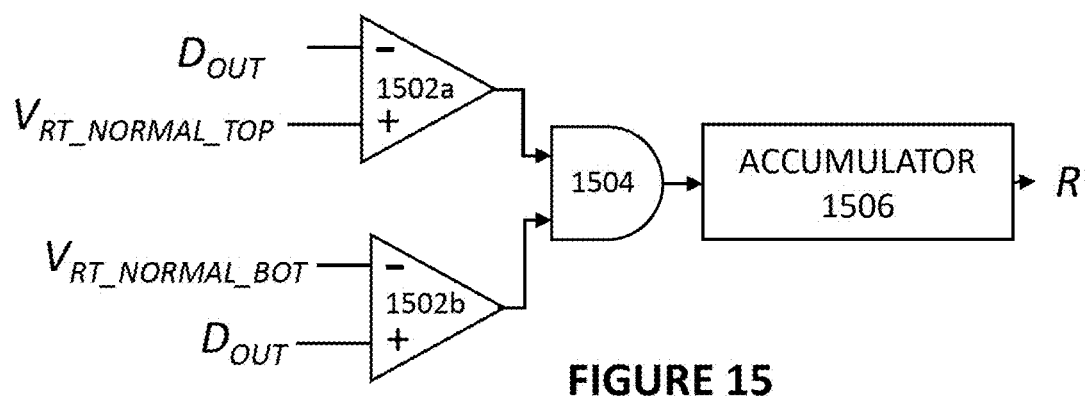
FIG. 15 illustrates an exemplary implementation of a return to normal detector, according to some embodiments of the disclosure.

FIG. 15 illustrates an exemplary implementation of a return to normal detector, according to some embodiments of the disclosure. In this example, two comparators 1502a-b are provided in a return to normal detector determine whether $D_{OUT}$ is within the range between $V_{RT\_NORMAL\_TOP}$ and $V_{RT\_NORMAL\_BOT}$. The outputs of the two comparators can be combined using an AND operator 1504 to ensure the signal is within the range (i.e., $D_{OUT}$ is smaller than $V_{RT\_NORMAL\_TOP}$ and also greater than $V_{RT\_NORMAL\_BOT}$). The output of the AND operator 1504 can be provided to an accumulator which can count the number of consecutive samples of $D_{OUT}$ within the range. The accumulator can reset when the AND operator 1504 signals that $D_{OUT}$ is outside of the range. The accumulator can provide a signal R (such as the one seen in FIG. 13) to signal to a coefficient controller to revert the coefficient values back to typical values if the accumulator has determined that $D_{OUT}$ has returned to normal for N number of samples. In some instances the signal R can indicate how long the signal has been within the range, e.g., a value maintained in the accumulator.

Recombining the Data

Since the STF gain changes depending on the overload detection, the digital output data has to be recombined to reflect this gain variation. The outputs can be scaled depending on the overload detection signal and its corresponding gain change in the STF, but since there is a delay through the loop filter of a continuous-time delta-sigma modulator, the corresponding changes in the STF and in the digital output data have to be realigned to reflect the difference. In other words, a method for overload protection further includes, in response to detecting the overload condition, adjusting a digital gain of a digital output of the delta-sigma modulator in accordance with a predetermined time delay from the adjustment of the one or more coefficients of the delta-sigma modulator. The digital gain would correspond to gain change in a signal transfer function of the delta-sigma modulator resulting from the adjustment of the one or more coefficients of the delta-sigma modulator. The predetermined time delay may not be perfectly defined and can be calibrated to a delay that gives the best results. It may be desirable to limit the STF gain changes to values that allow the digital gain to be accomplished with simple bit shifts and sums, e.g., ×2, ×1.5, ×1.25, ×1.75, etc. Matching of the analog gain and digital gain is critical to minimize steps in the output from gain switching.

VARIATIONS AND IMPLEMENTATIONS

While it has been demonstrated that the front-end coefficients of the delta-sigma loop can be adjusted to accommodate larger input signals while the delta-sigma is still operating (i.e., the front-end feedback DAC as well as the front-end integrator/LC buffer gain), there are other combinations of coefficients throughout the delta-sigma loop that could be adjusted instead of the front-end coefficients to tolerate the larger input signal, including capacitors, resistors and DAC currents. The backend coefficients can also be adjusted as well, if desired.

The overload detection scheme presented is not exhaustive; comparators could be used at multiple stages throughout the delta-sigma loop (or at the flash output) to determine the signal amplitudes, and the combination of their results could be used to make a decision as to whether or not the coefficients and DAC currents should be adjusted. For instance, an overload detector can detect an overload condition based on signal levels at a plurality ones of the one or more nodes in the delta-sigma modulator.

Some variations can include more than one input for the overload detector 302, e.g., accepting a plurality of voltages ($V_{NODE\_1}$, $V_{NODE\_2}$, ... $V_{NODE\_N}$) and observing whether the level of those voltages exceed a certain threshold. One or more of those level of voltages exceeding a certain threshold can cause the overload detector to generate an overload signal or a plurality of overload signals. The overload signal(s) can cause the coefficient controller to generate one or more coefficient signals. Generally speaking, signal inputs and outputs of the overload detector, the coefficient controller, and the return to normal detector can vary depending on the application. Furthermore, the number of these components can also vary depending on the application (e.g., a plurality of overload detectors can be used).

Also, the scheme to determine whether the signal has return to normal can be expanded; a certain percentage of samples or certain number of signals below a threshold could be used to make the decision. Alternatively the comparator outputs from the overload detector could be used to determine the level of the internal states of the modulator (or the input) to determine whether or not the amplitude has returned to normal (in place or with the return to normal detector).

In some embodiments, the DS modulator and its functions can be parameterizable, where a user can provide certain signals to reconfigure the parameters of the DS modulator. For instance, parameters can specify which one or ones of the node(s) is to be used for overload detection, and/or a manner in which overload condition is detected. In another instance, the parameters can specify which coefficients to adjust in response to an overload condition, and/or the manner in which the coefficients should be adjusted in response to an overload condition (i.e., different amounts of compensation). Voltage references can also be parameterizable. In some instances, the DS modulator be parameterizable to operate in different modes, e.g., one mode with one level of overload detection or another mode with multiple levels of overload detection. The number of levels of overload detection can also be paramerizable by a user, and/or by a software program stored on computer-readable storage medium. These variations are not intended to be exhaustive.

The overload detector, the coefficient controller, and the return to normal detector are described herein with voltage mode circuits. However, they can be implemented using equivalent current mode circuits, or circuits which mixes voltage levels and current levels.

While the present disclosure describes various applications of the overload protection in continuous time DS modulators, the same techniques can be applied to discrete time DS modulators, or DS modulators implemented with both continuous time and discrete time circuits.

In the discussions of the embodiments above, the capacitors, comparators, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure. For instance, although metal-oxide semiconductor field-effect transistors (MOSFETs) are shown in FIGS. 9 and 10, it is envisioned that these current sources can be provided with other equivalent or complementary transistors or devices. For instance, n-type devices can be replaced with p-type devices with an "upside down" topology. In some cases, MOSFETs can be replaced with bipolar junction transistors.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the overload protection functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve signal processing, particularly those that can execute specialized software programs, or algorithms, some of which may be associated with converting an analog signal to a digital signal and processing such digital signal. Certain embodiments can relate to multi-DSP signal processing, floating point processing, signal/control processing, fixed-function processing, microcontroller applications, etc. In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems utilizing a delta-sigma ADC.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision or high-speed data conversion products in battery monitoring, control systems, reporting controls, maintenance activities, etc. In yet other example scenarios, the teachings of the present disclosure can be applicable in the industrial markets that include process control systems that help drive productivity, energy efficiency, and reliability. In consumer applications, the teachings of the signal processing circuits discussed above can be used for products related to image processing.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to overload protection, illustrate only some of the possible functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

Parts of various apparatuses for providing overload protection embeddable in a delta-sigma modulator can include electronic circuitry to perform the functions described herein. In some cases, one or more parts of the apparatus can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer medium.

What is claimed is:

1. A method for providing overload protection embedded in a delta-sigma modulator, the method comprising:
   detecting an overload condition in the delta-sigma modulator using an overload detector connected to one or more nodes in the delta-sigma modulator; and
   in response to detecting the overload condition, adjusting a current gain of a feedback digital-to-analog converter of the delta-sigma modulator, and adjusting a size of a resistor positioned between an output of an amplifier of a front-end of the delta-sigma modulator and a backend of the delta-sigma modulator to compensate for the detected overload condition.

2. The method of claim 1, wherein:
   the overload condition is detected if a signal level at the one or more nodes is above a first threshold or below a second threshold.

3. The method of claim 1, further comprising:
   changing a gain of a signal transfer function of the delta-sigma modulator while keeping a noise transfer function of the delta-sigma modulator or a loop gain of the delta-sigma modulator substantially unchanged.

4. The method of claim 1, wherein:
   adjusting the current gain of the feedback digital-to-analog converter of the delta-sigma modulator increases the current gain and adjusting the size of the resistor substantially preserves a loop gain of the delta-sigma modulator.

5. The method of claim 1, wherein:
   adjusting the current gain of the feedback digital-to-analog converter increases the current gain and adjusting the size of the resistor increases the size of the resistor.

6. The method of claim 1, further comprising:
   determining whether the delta-sigma modulator has exited the overload condition for a period of time; and
   in response to determining the delta-sigma modulator has exited the overload condition for the period of time, adjusting the delta-sigma modulator to decrease compensation for the overload condition.

7. The method of claim 6, further comprising:
   adjusting the size of a feedback capacitor of the amplifier of the delta-sigma modulator to adjust a gain of an integrator or LC buffer of the delta-sigma modulator.

8. The method of claim 6, wherein determining whether the delta-sigma modulator has exited the overload condition comprises determining whether one or more signal levels of the one or more nodes of the delta-sigma modulator is within a normal range for the period of time.

9. The method of claim 1, further comprising:
   in response to detecting the overload condition, adjusting a digital gain of a digital output of the delta-sigma modulator in accordance with a predetermined time delay from the adjustment of the delta-sigma modulator, wherein the digital gain corresponds to gain change in a signal transfer function of the delta-sigma modulator resulting from the adjustment of the delta-sigma modulator.

10. An apparatus for providing overload protection, said apparatus embedded in a delta-sigma modulator, the apparatus comprising:
    a overload detector connected to one or more nodes in the delta-sigma modulator for detecting an overload condition in the delta-sigma modulator; and
    a coefficient controller for adjusting coefficients of the delta-sigma modulator to compensate for the detected overload condition in response to detecting the overload condition, wherein the coefficients comprises: a first coefficient of the coefficients corresponds to a current gain of a feedback digital-to-analog converter of the delta-sigma modulator, and a second coefficient corresponds to a size of a resistor between an output of an amplifier of a front-end of the delta-sigma modulator and a backend of the delta-sigma modulator.

11. The apparatus of claim 10, wherein the one or more nodes include an input node to the front-end of the delta-sigma modulator.

12. The apparatus of claim 10, wherein the one or more nodes include an output node of an integrator or LC buffer of the delta-sigma modulator.

13. The apparatus of claim 10, wherein the one or more nodes include an output of an analog-to-digital converter of the delta-sigma modulator.

14. The apparatus of claim 10, wherein the one or more nodes include one or more nodes of a first stage of the delta-sigma modulator and one or more nodes of a second stage of the delta-sigma modulator.

15. The apparatus of claim 10, wherein the overload detector detects an overload condition based on signal levels at a plurality ones of the one or more nodes in the delta-sigma modulator.

16. The apparatus of claim 10, further comprising:
    a return to normal detector for:
        determining whether the delta-sigma modulator has exited the overload condition for a period of time; and
        in response to determining the delta-sigma modulator has exited the overload condition for the period of time, signaling to the coefficient controller to adjust the coefficients to decrease compensation for the overload condition.

17. A method for providing overload protection, the method comprising:
    determining a level from different levels of overload condition of a delta-sigma modulator;
    changing internal coefficients of the delta-sigma modulator affecting an analog gain of a signal transfer function of the delta-sigma modulator based on a determined level of overload condition to compensate for the determined level of overload condition while keeping a noise transfer function of the delta-sigma modulator substantially unchanged; and adjusting a digital gain of a digital output of the delta-sigma modulator corresponding to the analog gain of the signal transfer function affected by the changing of the internal coefficients in accordance with a predetermined time delay of the delta-sigma modulator.

18. The method of claim 17, wherein the adjusting of the digital gain comprises one or more of: bit shifting and summing.

19. The method of claim 17, further comprising:

determining whether samples of the digital output are within a predetermined range for a number of samples; and adjusting the analog gain and the digital gain to decrease compensation for the determined level of overload condition in response to determining that the samples of the digital output are within the predetermined range for the number of samples.

20. The method of claim 17, wherein determining the level from different levels of overload condition comprises comparing an analog voltage signal at a node of the delta-sigma modulator against a plurality of reference voltages.

* * * * *